United States Patent [19]
Liao et al.

[11] Patent Number: 5,878,918
[45] Date of Patent: Mar. 9, 1999

[54] PHOTORESIST SUPPLYING SYSTEM FOR USED IN A SEMICONDUCTOR FABRICATION

[75] Inventors: Jerry Liao, Taipeim; C. H. Huang, Yi Lan; T. Y. Liu, Hsinchu; Ray Peng, Miao Li, all of Taiwan

[73] Assignee: Taiwan Semiconductor Manufacturing Co., Ltd., Taiwan

[21] Appl. No.: 848,994

[22] Filed: May 2, 1997

[51] Int. Cl.[6] ........................................ B67D 5/08
[52] U.S. Cl. ........................... 222/189.06; 222/394
[58] Field of Search .................. 222/1, 61, 189.06, 222/394, 399, 152

[56] References Cited

U.S. PATENT DOCUMENTS

| | | | |
|---|---|---|---|
| 5,148,945 | 9/1992 | Geatz | 222/189.06 X |
| 5,316,181 | 5/1994 | Burch | 222/399 X |
| 5,330,072 | 7/1994 | Ferri, Jr. et al. | 222/189.06 X |
| 5,370,269 | 12/1994 | Bernosky et al. | 222/61 |
| 5,383,574 | 1/1995 | Raphael | 222/1 |
| 5,636,762 | 6/1997 | Juhola et al. | 222/152 X |

*Primary Examiner*—Kevin P. Shaver
*Attorney, Agent, or Firm*—Finnegan, Henderson, Farabow, Garrett & Dunner, L.L.P.

[57] ABSTRACT

A photoresist supplying system for used in a semiconductor fabrication, the system includes a photoresist holder for storing photoresist. A first gas supplier is connected to the photoresist holder for providing gas to the photoresist holder to force the photoresist out of the photoresist holder. A buffer is connected to the photoresist holder via an input terminal to exhaust the gas, the photoresist is output by an output terminal of the buffer. A first valve is connected to the output terminal of the buffer for controlling the flowing rate of the photoresist. A second valve is connected to the buffer to drain the gas collected by the space. A pumping apparatus is connected to the first valve via an input terminal to suck the photoresist. A filter is connected to the pumping apparatus to filter out the impurity in the photoresist. A vibrator is set in the photoresist supplying system to hold the filter for eliminating bubble. A suckback apparatus is connected to the filter to suck back over quantity photoresist before the photoresist is sprayed on a wafer.

6 Claims, 2 Drawing Sheets

PHOTORESIST SUPPLYING SYSTEM FOR USED IN A SEMICONDUCTOR FABRICATION

FIELD OF THE INVENTION

The present invention relates to a system used in the formation of integrated circuit (IC), and more specifically, to a photoresist supplying system for the fabrication of semiconductor devices.

BACKGROUND OF THE INVENTION

Lithography process is widely used in the formation of Integrated circuits. It is one of the most important processes in the semiconductor fabrication. That is because the formation of the integrated circuits require that precisely controlled quantities of dopants be implanted into tiny regions of a layer or a wafer. Further, the sizes of various circuit elements, from transistor bases to lead widths, must be determined and their exact position on the chip established.

Typically, the photoresist is applied as a thin film to a wafer or an underlying layer, and then exposed through a mask (or reticle in step-and repeat projection system). The mask contains clear and opaque features that define the pattern to be created in the photoresist layer. The regions in the photoresist exposes to the light are made either soluble or insoluble in a specific solvent known as a development. Following development, the regions of the underlying layer no longer covered by the photoresist are removed by etching, thereby replicating the mask pattern in that underlying layer. In general, photoresist has several components. For example, the resin is one of the components. A sensitizer is very photosensitive. Since the exposure process requires changes in molecular bonding, substantial photo energy such as ultraviolet light is required. In general, photoresist is used to serve an etching mask or an ion implantation mask. The pattern in the photoresist is generated when the substrate undergoes the step of development. The residual photoresist is left on the underlying layer to prevent a portion of the underlying layer from etching or to serve a mask for implantation.

However, one of the problems related to the photoresist supplying system is the poor coating of the photoresist. It is due to bubbles trapped in the photoresist supplying system. The photoresist supplying system force the photoresist to spray on the wafer via gas. The residual gas may be trapped in the photoresist supplying system. In addition, the gas may be come from the procedure of filter replacement. The gas may get into the filter while the filter is dismantled from the system for replacement. Thus, the bubbles are generated by this procedure. Therefore, the control of the photoresist volume becomes difficult due to the bubbles that are trapped in the pipe, the filter of the system. While the bubbles are dispensed on the wafer, they will cause poor coating on the wafer. Thus, what is required is a photoresist supplying system that will eliminate the residual bubble in the system.

SUMMARY OF THE INVENTION

The present invention includes at least one photoresist holder used for providing photoresist to the system. A first gas supplier is connected to the photoresist holder for providing gas to the photoresist holder via a pipe. The gas that provided by the first gas supplier will force the photoresist flow out of the photoresist holder. A buffer is connected to the photoresist holder to exhaust the gas out of the system. A valve is connected to the output portion of the buffer. The valve is utilized to control the flowing rate of the photoresist. A pump is connecting to the valve via an input terminal. The pump is used to suck the photoresist from the photoresist holder. A filter is connected to the output terminal of the pump for filtering out impurities in the photoresist. A vibrator is set in the system to hold the filter. The vibrator is used to eliminate the bubble in the photoresist. A suckback apparatus is connected to the output terminal of the filter. The purpose of using the suckback apparatus is to such back the over quantity of photoresist before the photoresist is sprayed on the wafer.

By practicing the system, the photoresist stored in the housing is drained out by using the gas provide by the first gas supplier. Then, the photoresist is flow into the buffer to exhaust the gas. Subsequently, the photoresist is flow into the filter via air valve and the pump. The impurities in the photoresist is filtered out by the filter. The vibrator is used to eliminate the bubbles in the filter. Then, the photoresist is sprayed on the wafer via the suckback apparatus.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
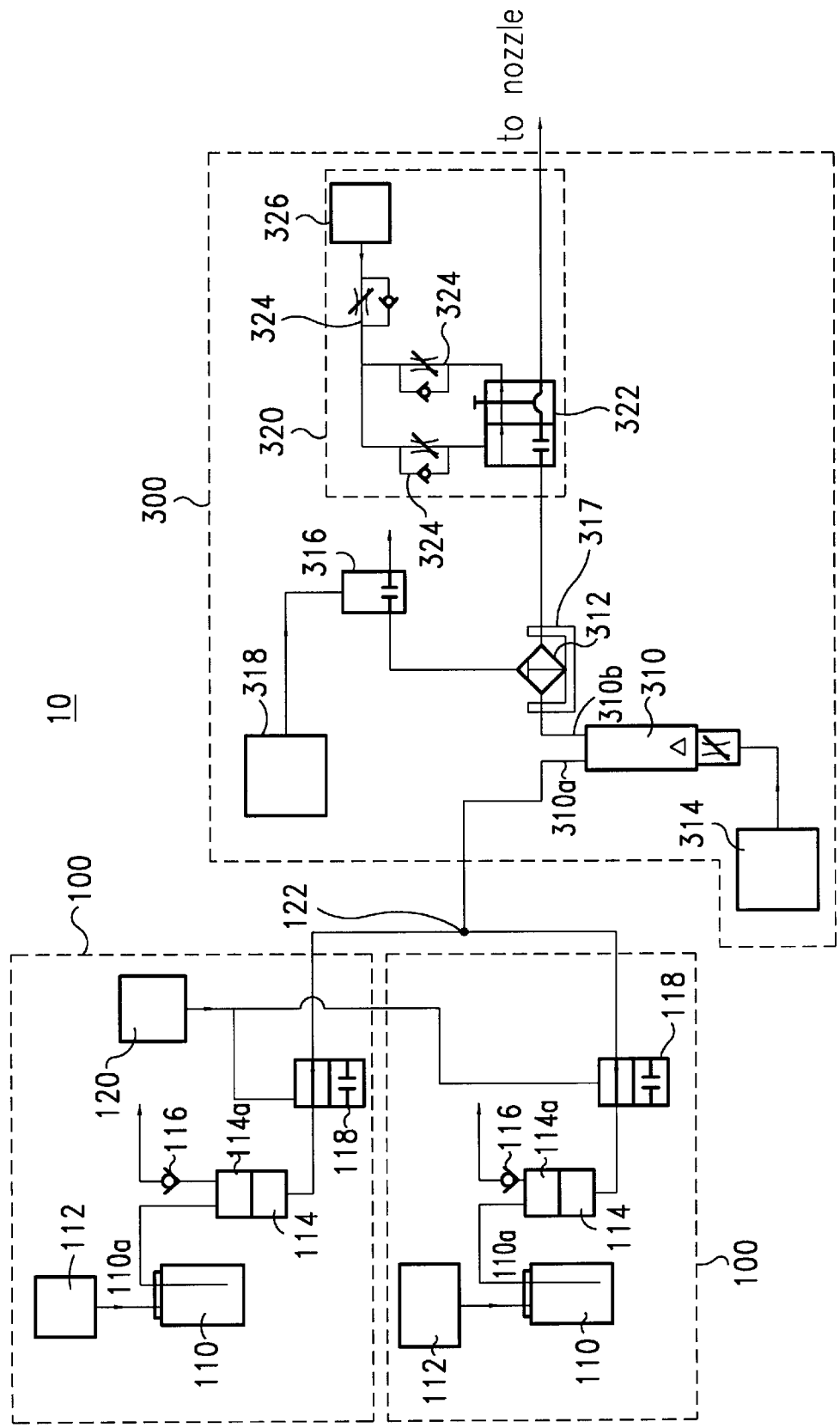
FIG. 1 is a schematic illustrating a photoresist supplying system in accordance with the present invention.

Referring to FIG. 1, it shown a schematic illustrating a photoresist supplying system 10 that includes at least one photoresist holder 100 used for providing photoresist to the system 10. A photoresist supplier 300 is connected to the photoresist holder to spray the photoresist on a wafer.

Still referring to FIG. 1, the photoresist holder 100 includes a container 110 used to store the photoresist. A first gas supplier 112 is connected to the container 110 for providing gas to the container 110 via a pipe 110a. The gas that provided by the first gas supplier 112 will force the photoresist flow out of the container 110. Typically, nitride or other suitable gas is provided by the first gas supplier 112. A buffer 114 is connected to the container 110 to exhaust the gas out of the system 10. Preferably, the buffer 114 is a tank having photoresist in it and the buffer 14 can not be completely filled with the photoresist. In the other word, the upper portion space 114a of the tank is used to collect the gas. Then, the gas that stay in the space 114a is exhausted out of the system 10 via a first valve 116.

Turning to FIG. 1, a second valve 118 is connected to the output portion of the buffer 14 that is set at the bottom of the tank. The second valve 118 is utilized to control the flowing rate of the photoresist. Preferably, an air valve is used to act the second valve 118. Thus, a second gas supplier 120 is connected to the second valve 118 for providing gas to the second valve 118 to control the status of the second valve 118. In general, the gas supplied by the second gas supplier 120 is air. The photoresist supplier 300 is then connected to the output terminal of the second valve 118 via a node 122. In a preferred embodiment, the photoresist supplying system 10 has at least another one photoresist holder 100. While one of the photoresist holders 100 is out of order, then another one can immediately take over the mission of the broken one.

Figure 2A:
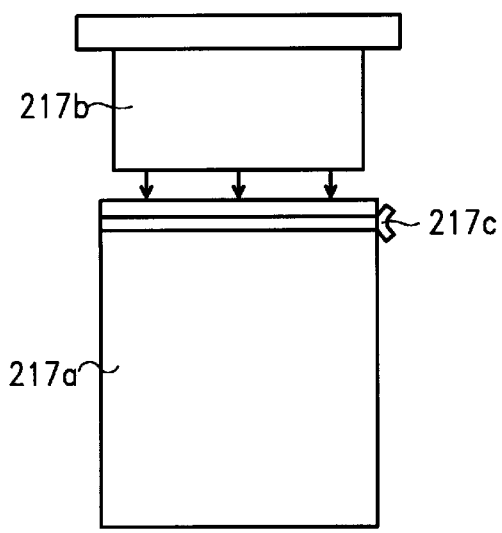
FIG. 2 (a) and FIG. 2(b) are schematics illustrating a vibrating means in accordance with the present invention.
Figure 2B:
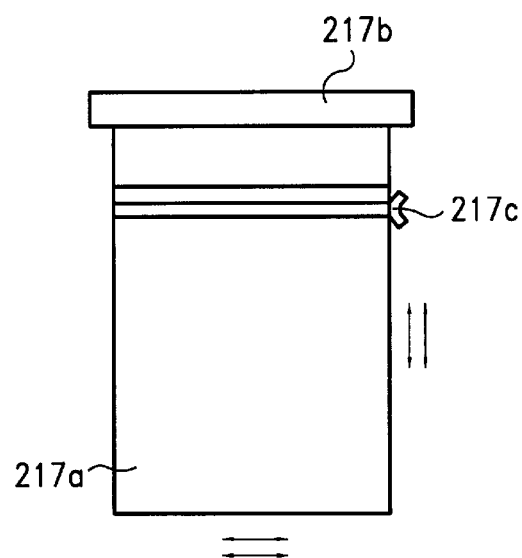

As shown in FIG. 1. the photoresist supplier 300 includes a pump 310 connecting to the node 122 via an input terminal 310a. The pump 310 is used to suck the photoresist from the photoresist holder 100. A third gas supplier 314 is connected to the pump 310 to provide gas to the pump for purging. A filter 312 is connected to the output terminal 310b of the pump 310 for filtering out impurities in the photoresist. A second air valve 316 is then connected to the output terminal of the filter 312 to drain the impurities. Of course, a forth gas supplier 318 is used to control the statue of the second air valve 316. A vibrating means 317 is set in the system 10 to hold the filter 312. The vibrating means 317 is used to eliminate the bubble in the photoresist. Therefore, the vibrating means 317 can vibrate along the vertical direction, the horizontal direction or both directions (as shown in FIG. 2b, the vibrating direction are indicated by arrows). It appreciates that any suitable direction can achieve above purpose. As shown in FIG. 2(a) and FIG. 2(b), the vibrating means 317 includes a base housing 217a for holding the elements of the vibrating means 317, such as a vibrator, a controlling IC etc,. A filter housing 217b is a container that is set on the base housing 217a. The filter 312 is set in the filter housing 217b. A fixer 217c is attached on the base housing 217b to fix the filter housing 217c. The vibrating means can generate vibration to accelerate bubble purge automatically via a controlling IC.

Still referring to FIG. 1, a suckback apparatus 320 is connected to the output terminal of the filter 312. The purpose of using the suckback apparatus 320 is to such back the over quantity of photoresist before the photoresist is sprayed on the wafer. The suckback apparatus 320 includes a suckback valve 322 connecting to the filter 312. A plurality of check valves 324 are connected to the suckback valve 322 to control the suckback valve 322. A fifth gas supplier 326 is connected to the check valves 324 to provide gas to the check valves 324. Then, the output terminal of the suckback apparatus 320 reaches a nozzle that is used to spray the photoresist on the wafer.

To illustrate the operation of the system of the present invention, a typical operational sequence of the photoresist supplying system will be described. First, the gas provide by the first gas supplier 112 force the photoresist stored in the container 110 to drain out of the container 110. Then, the gas is exhausted by the buffer 114 via a valve 116. Subsequently, the photoresist flows into the filter 312 via air valve 118 and the pump 310. The impurities in the photoresist is filtered out by the filter 312 and be drain out of the system via the valve 316. The vibrator 317 is used to eliminate the bubbles in the filter 312. Then, the photoresist is sprayed on the wafer by a nozzle.

As is understood by a person skilled in the art, the foregoing preferred embodiment of the present invention is illustrated of the present invention rather than limiting of the present invention. For example, one or more than one of the photoresist holder can be used for the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A photoresist supplying system for used in a semiconductor fabrication, said system comprising:

a photoresist container for storing photoresist;

a first gas supplier connected to said photoresist container for providing gas into said photoresist container to force said photoresist out of said photoresist container;

a buffer connected to said photoresist container via an input terminal to exhaust said gas, said buffer having at least a portion of space to collect said gas, said photoresist being output by a first output terminal of said buffer, said buffer having a second output terminal;

a first valve connected to said first output terminal of said buffer for controlling the flowing rate of said photoresist;

a second valve connected to said second output terminal of said buffer to drain said gas collected by said space;

pumping means connected to said first valve via an input terminal to suck said photoresist, said photoresist being output via an output terminal of said pumping apparatus;

a second gas supplier connected to said pumping apparatus for pump purge;

a filter connected to said output terminal of said pumping apparatus to filter out the impurity in said photoresist, a third valve connected to said filter to drain said impurity;

vibrating means set in said photoresist supplying system to hold said filter for eliminating bubble; and suckback apparatus connected to said filter to suck back over quantity photoresist before said photoresist being sprayed on a wafer.

2. The system of claim 1, wherein said second valve is an air valve.

3. The system of claim 2, wherein said system further comprises a third gas supplier to provide gas to said second valve.

4. The system of claim 1, wherein said third valve is an air valve.

5. The system of claim 4, wherein said system further comprises a forth gas supplier to provide gas to said second valve.

6. The system of claim 1, wherein said vibrating means comprises:

a base housing for holding a vibrator, a controlling IC;

a filter housing connected to said base housing for holding said filter; and fixing means attached on said base housing to fix said filter housing.

* * * * *